(12) United States Patent
Yanni

(10) Patent No.: US 9,196,329 B1
(45) Date of Patent: Nov. 24, 2015

(54) COMBINATORIAL FLIP FLOP WITH OFF-PATH SCAN MULTIPLEXER

(71) Applicant: Marvell Israel (M.I.S.L) Ltd., Yokneam (IL)

(72) Inventor: Meny Yanni, Raanana (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 14/088,885

(22) Filed: Nov. 25, 2013

Related U.S. Application Data

(60) Provisional application No. 61/731,324, filed on Nov. 29, 2012, provisional application No. 61/745,896, filed on Dec. 26, 2012.

(51) Int. Cl.
*G11C 7/00* (2006.01)
*G11C 7/22* (2006.01)

(52) U.S. Cl.
CPC ........................................ *G11C 7/22* (2013.01)

(58) Field of Classification Search
CPC ................................. G11C 7/10; G11C 7/222
USPC .................................................... 365/189.02
See application file for complete search history.

(56) References Cited

U.S. PATENT DOCUMENTS

| | | | | | |
|---|---|---|---|---|---|
| 5,774,473 | A | * | 6/1998 | Harley | 714/30 |
| 5,986,918 | A | * | 11/1999 | Lee | 365/103 |
| 6,424,577 | B2 | * | 7/2002 | Sim | 365/189.05 |
| 7,284,174 | B2 | * | 10/2007 | Dubey | 714/727 |
| 7,383,481 | B2 | * | 6/2008 | Warren et al. | 714/726 |
| 7,747,917 | B2 | * | 6/2010 | Putman et al. | 714/726 |
| 7,843,218 | B1 | * | 11/2010 | Ramaraju et al. | 326/46 |
| 7,852,108 | B1 | * | 12/2010 | Lesea | 326/15 |
| 7,949,916 | B1 | * | 5/2011 | Ang | 714/726 |
| 8,067,971 | B2 | * | 11/2011 | Hoxey | 327/211 |
| 8,209,572 | B2 | * | 6/2012 | Ross et al. | 714/718 |
| 8,355,283 | B2 | * | 1/2013 | Roohparvar et al. | 365/185.17 |
| 8,437,213 | B2 | * | 5/2013 | Deng et al. | 365/226 |
| 8,453,024 | B2 | * | 5/2013 | Whetsel | 714/726 |
| 8,493,119 | B2 | * | 7/2013 | Leach et al. | 327/202 |
| 8,656,233 | B2 | * | 2/2014 | Chakravarty | 714/726 |
| 8,832,510 | B2 | * | 9/2014 | Kukreja et al. | 714/729 |
| 8,880,965 | B2 | * | 11/2014 | Zhang et al. | 714/726 |

\* cited by examiner

*Primary Examiner* — Michael Tran

(57) ABSTRACT

Systems and methods are provided for a data storage cell. A pass gate, controlled by one or more clock signals, is configured to selectively pass data to a keeper circuit. A multiplexer device is disposed in the keeper circuit and is configured to select one of the data that is passed to the keeper or a scan input.

20 Claims, 6 Drawing Sheets

US 9,196,329 B1

COMBINATORIAL FLIP FLOP WITH OFF-PATH SCAN MULTIPLEXER

CROSS-REFERENCE TO RELATED APPLICATIONS

The present application claims priority from U.S. Provisional Application Ser. No. 61/731,324 entitled "Combinatorial Flipflop," filed 29 Nov. 2012 and U.S. Provisional Application Ser. No. 61/745,896 entitled "Fast Data Path Mux Latch," filed 26 Dec. 2012, the entirety of both of which is hereby incorporated by reference.

FIELD

This disclosure is related generally to electronic circuit design and more particularly to the design of flip flops.

BACKGROUND

Slow data storage accesses can result in bottlenecks in integrated circuit performance. The desire for high speed, low complexity data storage is counterbalanced by a common requirement for testing circuits to be built into data storage devices. Such testing circuits can increase data storage latency.

The description above is presented as a general overview of related art in this field. and should not be construed as an admission that any of the information it contains constitutes prior art against the present patent application.

SUMMARY

Systems and methods are provided for a data storage cell. A pass gate, controlled by one or more clock signals, is configured to selectively pass data to a keeper circuit. A multiplexer device is disposed in the keeper circuit is configured to select one of the data that is passed to the keeper circuit or a scan input.

As another example, a computer-implemented method of storing data receives data at an input node. The received data is provided to an inverter, where the inverted data is received at an output node. A multiplexer positioned on a feedback path from the output node to the input node is used to select from between the inverted data from the output node and a scan input signal to propagate to the input node.

DETAILED DESCRIPTION

Figure 1:
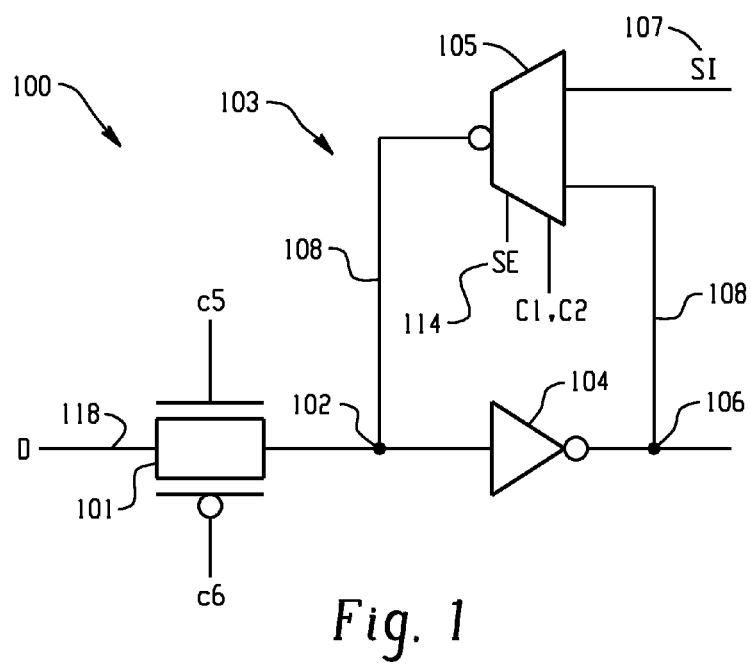
FIG. 1 is circuit diagram depicting a data storage cell.

FIG. 1 is circuit diagram depicting a data storage cell in one embodiment of the disclosure. The data storage cell 100 includes a pass gate 101, controlled by one or more clock signals C5, C6, configured to selectively pass data to a keeper circuit 103. The keeper circuit 103 includes a multiplexer device 105 configured to select one of the data that is passed to the keeper circuit 103 or a scan input 107.

The keeper circuit 103 includes an input node 102 configured to receive data. An inverter 104 is responsive to the input node 102 and an output node 106. A feedback path 108 connects the output node 106 to the input node 102. The multiplexer 105 is positioned on the feedback path 108 and is configured to select between data from the output node 106 and the scan input signal 107 to propagate to the input node 102. The multiplexer 105, in one embodiment, is controlled by a pair of clock signals C1, C2, described in further detail with reference to FIG. 2.

During an operational mode, the data storage cell 100 receives data for storage at the input node 102, The scan input signal 107 provides a second mechanism for inputting data to the data storage cell 102 in a testing mode. in such a testing mode, in one embodiment of the disclosure, one or more test patterns of data are written to a plurality of data storage cells, such as the data storage cell 100 of FIG. 1, that are typically arranged in a scan chain, and the test patterns are then read out to test the data storage functionality of the data storage cell 100. The testing mode is signaled by assertion of a scan enable signal 114. When the scan enable signal 114 is active, the multiplexer 105 is configured to operate in a scan mode that propagates the scan input signal 112 to the input node 102. When the scan enable signal 114 is inactive, the multiplexer 105 is configured to operate in a data mode that propagates data from the output node 106 to the input node 102.

In one embodiment of the disclosure, the data storage cell 100 further includes the pass gate 101 that is configured to receive data at 118 and to selectively provide the data received to the input node 102. The pass gate 101 is controlled by at least one clock signal, and in the embodiment seen by a pair of clock inputs C5, C6, where those clock signals are influenced by the scan enable signal 114 in certain modes of operation, as described in further detail with reference to FIG. 2. Generally, when the scan enable signal 114 is active, the scan enable influenced clock control inputs C5, C6 are configured to command the pass gate 101 to block incoming received data 118 from propagation to the input node 102 to prevent interference with scan input signal 112 data.

The data storage cell 100 of FIG. 1 provides data storage (e.g., storage of one bit of data). The latency of a data storage cell is based in part on the number of circuit devices between an input to the data storage cell at 102 or 118 and the output of the data storage cell at 116. By positioning the test mode initiating multiplexer 105 on the feedback path 108, the multiplexer 105 does not have a direct effect on the input 102, 118 to output path 106 because the multiplexer 105 does not incorporate any propagation delay along the data path from 102 to 106.

Figure 2:
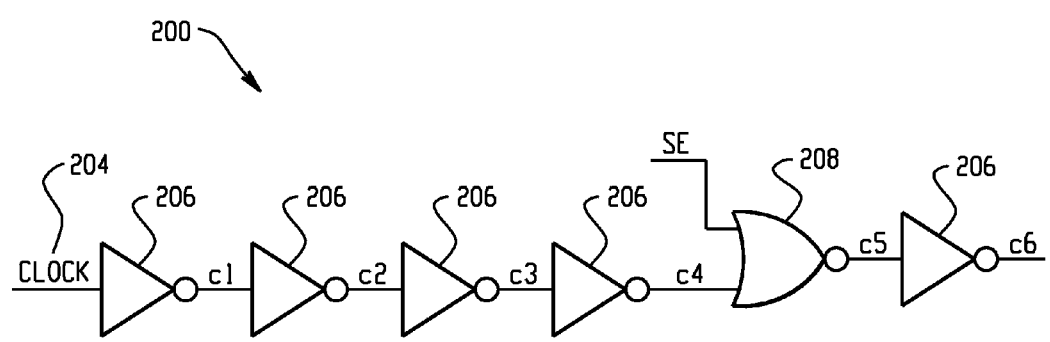
FIG. 2 is a diagram depicting circuit elements of a clock chain.

FIG. 2 is a diagram depicting circuit elements of a clock chain that provide clock signals to data storage cells, such as the data storage cell depicted in FIG. 1. A data storage cell clock chain 200 includes a clock input 204 for receiving an external clock signal. The clock chain 200 comprises a plurality of serially connected inverters 206 having clock taps in between the inverters 206 in the clock chain for providing clock signals to nodes of a data storage cell. Thus, a signal representing the clock signal 204 delayed by one unit by a first inverter is available at C1, and a signal representing the clock signal 204 delayed by two units by a first inverter and a second inverter is available at C2. In the embodiment disclosed in FIG. 1, the C1 and C2 signals are utilized to control the selection (data from output node 106 or scan input signal 112 based on the scan enable signal 114) and sampling of data.

The clock chain further includes an NOR gate 208 that is responsive to a four-time delayed clock signal C4 and the scan enable signal that is outputted at C5, with an inverted version of C5 being available at C6. When the scan enable signal is asserted, the outputs at C5 and C6 are fixed, regardless of the clock input from C4, such that the pass gate 116 of FIG. 1 blocks incoming data received at 118 from propagation to the input node 102.

In one embodiment of the disclosure, the clock taps of the clock chain depicted in FIG. 2 are provided to multiple data storage cells, such as the data storage cell depicted in FIG. 1. In other embodiments, each data storage cell includes a dedicated clock chain for providing clock signals.

Figure 3:
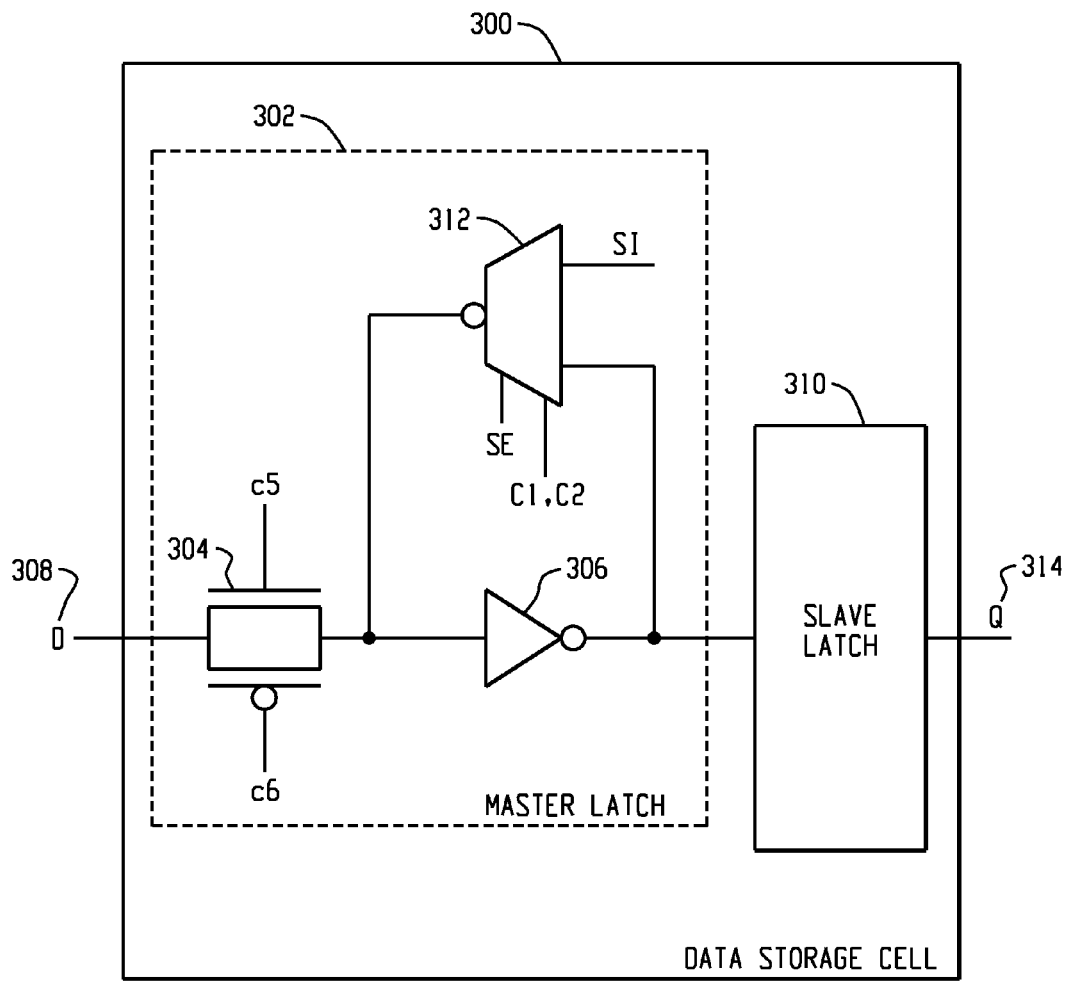
FIG. 3 is a block diagram depicting the integration of a data storage cell with a slave latch.

FIG. 3 is a block diagram depicting a data storage cell, such as a flip flop, that includes a master latch, which includes a data storage cell as depicted in FIG. 1, integrated with a slave latch. A data storage cell 300 includes a master latch 302 having a pass gate 304 and an inverter 306 along a path between a data storage cell input 308 and an output to a slave latch 310. The master latch 302 further includes a multiplexer 312 positioned on a feedback path of the master latch 302 configured to selected between data from the output of the master latch 302 and a scan input signal to propagate to the inverter 306 input. The slave latch 310 samples data present at the output of the inverter 306 and further stores that data for access at a Q output 314 of the data storage cell 300. The incorporation of the slave latch 310 increases stability of the data storage cell in one embodiment of the disclosure over a data storage cell that includes only the master latch 302. In one embodiment of the disclosure, the slave latch 310 includes only a single inverter along a data path from the input of the slave latch 310 to the output of the data storage cell 314, as depicted in further detail in the example of FIG. 4. In that embodiment, the entire data storage cell 300 includes only two inverters along the path from input 308 to output 314, as illustrated in FIG. 4.

Figure 4:
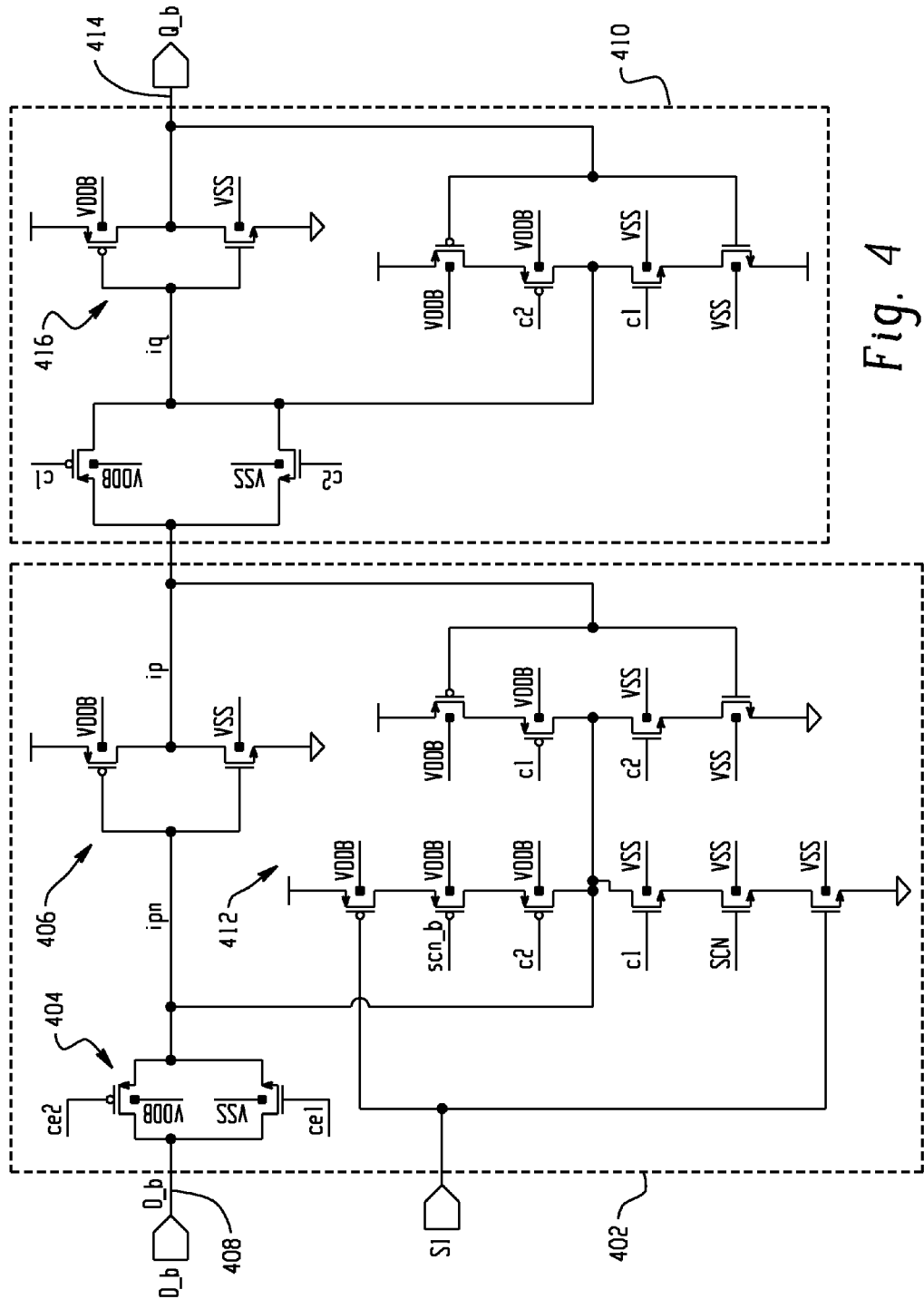
FIG. 4 is a diagram depicting details of a master latch-slave latch configuration in one embodiment of the disclosure.

FIG. 4 is a diagram depicting further design details of a master latch-slave latch configuration in one embodiment of the disclosure. In one embodiment of the disclosure, the master latch-slave latch configuration depicted in FIG. 4 provides an implementation of the data storage cell depicted in FIG. 3. A master latch 402 having a pass gate 404 and an inverter 406 along a path between a data storage cell input 408 and an output to a slave latch 410. The master latch 402 further includes an inverting multiplexer 412 positioned on a feedback path of the master latch 402 configured to select between data from the output of the master latch 402 and a scan input signal to propagate to the inverter 406 input. The slave latch 410 samples data present at the output of the inverter 406 and further stores that data for access at an output 414 of the data storage cell. The slave latch 410 includes only a single inverter 416 along a data path from the input of the slave latch 410 to the output of the data storage cell 414. Thus, the entire data storage cell includes only two inverters 406, 416 along the path from input 408 to output 414.

Figure 5:
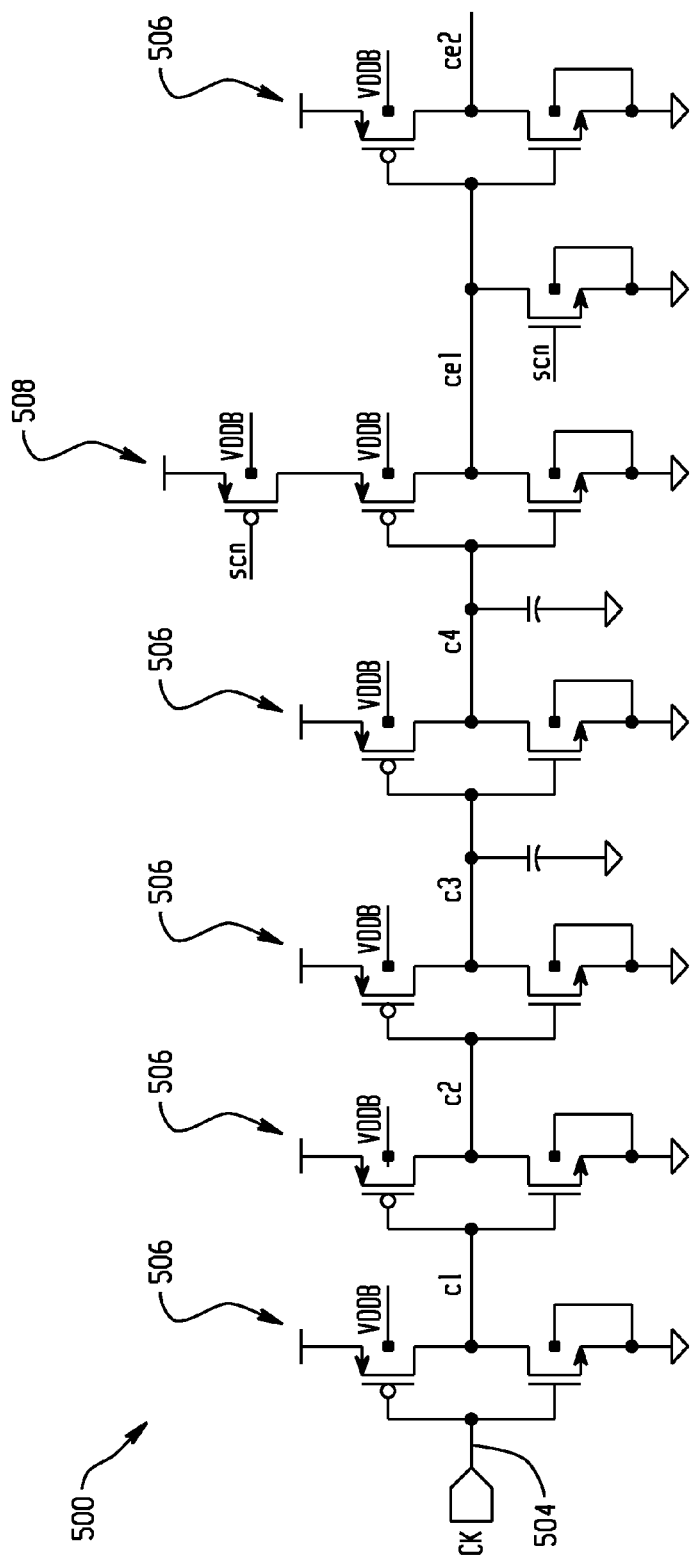
FIG. 5 is a diagram depicting details of a clock chain in one embodiment of the disclosure.

FIG. 5 is a diagram depicting details of a clock chain in one embodiment of the disclosure. In one embodiment of the disclosure, the clock chain configuration depicted in FIG. 5 provides an implementation of the clock chain illustrated in FIG. 2. A data storage cell clock chain 500 includes a clock input 504 for receiving an external clock signal. The clock chain 500 comprises a plurality of serially connected inverters 506 having clock taps in between the inverters 506 in the clock chain for providing clock signals to nodes of a data storage cell. Thus, a signal representing the clock signal delayed by one unit by a first inverter is available at C1, and a signal representing the clock signal delayed by two units by a first inverter and a second inverter is available at C2. The clock chain further includes an NOR gate 508 that is responsive to a four-time delayed clock signal C4 and the scan enable signal that is outputted at C5, with an inverted version of C5 being available at C6. When the scan enable signal is asserted, the outputs at C5 and C6 are fixed, regardless of the clock input from C4, such as for blocking incoming data during a test mode of the data storage cell.

Figure 6:
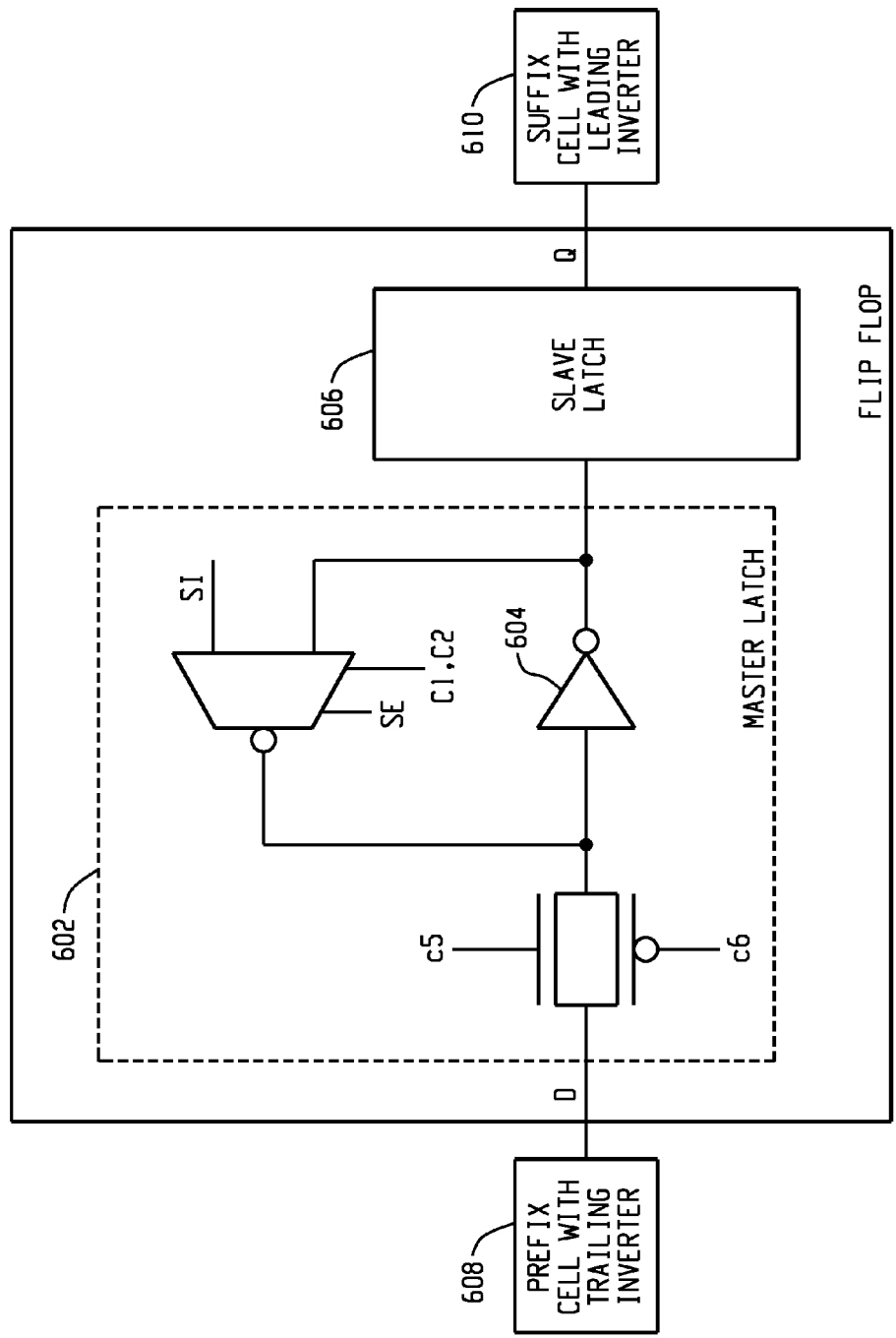
FIG. 6 is a diagram depicting integration of a flip flow with prefix and suffix logic cells.

FIG. 6 is a diagram depicting integration of a flip flow with prefix and suffix logic cells. In certain embodiments of the disclosure, a flip flop data storage cell is described that includes only two inverters on a data path from input to output. For example, in FIG. 6, a master latch 602 includes a first inverter 604 on the path from flip flop input to a slave latch 606 also includes a single inverter along that path (e.g., as shown in FIG. 4). The utilization of only two inverters offers low flip flop latency. The stability of the depicted flip flop in FIG. 6 is increased through integration with a prefix Logic cell 608 having an inverter as its last circuit element before an output that is propagated to the flip flop. The stability is further increased through integration with a suffix logic cell 610 having an inverter as its first circuit element following input from the flip flop output.

Figure 7:
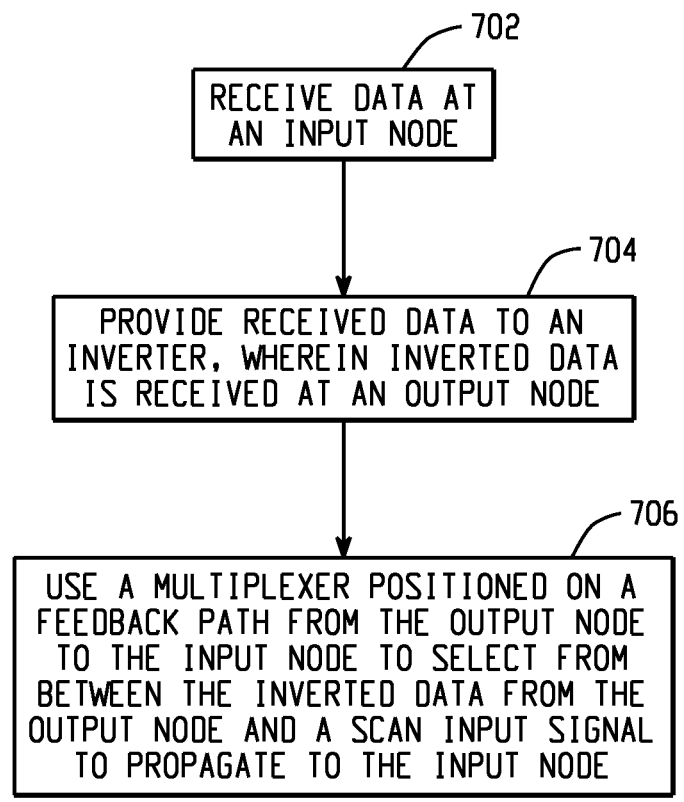
FIG. 7 is a flow diagram depicting a method of storing data.

FIG. 7 is a flow diagram depicting a method of storing data. A computer-implemented method of storing data receives data at an input node at 702. At 704, the received. data is provided to an inverter, where the inverted data is received at an output node. At 706, a multiplexer positioned on a feedback path from the output node to the input node is used to select from between the inverted data from the output node and a scan input signal to propagate to the input node.

This application uses examples to illustrate the invention. The patentable scope of the invention includes other examples.

The invention claimed is:

1. A data storage cell, comprising:
    a pass gate, controlled by one or more clock signals, configured to selectively pass data to a keeper circuit;
    a multiplexer device disposed in the keeper circuit, the multiplexer device comprising (i) a first input configured to receive the data that is to be passed to the keeper circuit from the pass gate, (ii) a second input configured to receive a scan input, and (iii) a control input configured to receive a control signal, the multiplexer device being configured to select one of the data received at the first input or the scan input received at the second input based on the control signal.

2. The data storage cell of claim 1, wherein the keeper circuit further comprises:
    an input node configured to receive data;
    an inverter responsive to the input node and an output node; and
    a feedback path from the output node to the input node;
    wherein the multiplexer device is positioned on the feedback path and is configured to select between data from the output node and the scan input.

3. The data storage cell of claim 2, wherein the multiplexer device is configured to select between the data from the output node and the scan input based upon a scan enable signal received at the control input.

4. The data storage cell of claim 3, wherein when the scan enable signal is active, the multiplexer device is configured to operate in a scan mode that propagates the scan input to the input node, and wherein when the scan enable signal is inactive, the multiplexer device is configured to operate in a data mode that propagates the data from the output node to the input node via the feedback path.

5. The data storage cell of claim 4, wherein the multiplexer device is further responsive to a clock control input, wherein when in the data mode, the multiplexer device is configured to propagate the data from the output node to the input node according to the clock control input.

6. The data storage cell of claim 4, wherein the pass gate is configured to receive the data and provide the received data to the input node when in the data mode.

7. The data storage cell of claim 6, wherein the pass gate is responsive to a scan enable influenced clock control input.

8. The data storage cell of claim 7, wherein when the scan enable signal is active, the scan enable influenced clock control input is configured to command the pass gate to block incoming received data from propagation to the input node.

9. The data storage cell of claim 3, further comprising a clock chain that comprises a plurality of serially connected inverters, wherein the clock chain includes a plurality of clock taps in between inverters in the clock chain, wherein the clock taps are configured to provide clock signals to nodes of the data storage cell.

10. The data storage cell of claim 9, wherein the clock chain includes a first inverter and a second inverter serially connected to the first inverter;
wherein a clock tap following the first inverter and a clock tap following the second inverter are configured to provide clock signals to the multiplexer device for timing sampling of a scan enable signal and for timing sampling of one of the data and the scan input.

11. The data storage cell of claim 10, wherein the multiplexer device is configured to propagate data from the output node to the input node based on the clock signals provided to the multiplexer device based on the clock tap following the second inverter when the scan enable signal is inactive.

12. The data storage cell of claim 9, wherein the clock chain further includes a circuit element that is responsive to the scan enable signal;
wherein the clock chain includes one or more clock taps following the circuit element that is responsive to the scan enable signal.

13. The data storage cell of claim 2, wherein the data storage cell includes exactly one inverter on a path between the input node and the output node.

14. The data storage cell of claim 13, further comprising a slave latch that is responsive to the output node for storing data sampled from the output node.

15. The data storage cell of claim 14, wherein the slave latch includes a slave input that is responsive to the output node and a slave output;
wherein the slave latch includes exactly one inverter on a path between the slave input and the slave output.

16. The data storage cell of claim 15, further comprising:
a prefix logic cell that includes a trailing inverter, the input node of the data storage cell being responsive to the trailing inverter; and
a suffix logic cell that includes a leading inverter, the leading inverter being responsive to the slave output.

17. The data storage cell of claim 1, wherein the data storage cell is configured to store exactly one bit of data.

18. A method of storing data in an integrated circuit, comprising:
receiving data at an input node;
providing the received data to an inverter, wherein the inverted data is received at an output node;
using a multiplexer disposed on a feedback path from the output node to the input node to select from between the inverted data from the output node and a scan input signal to propagate to the input node, the multiplexer being responsive to (i) a scan enable signal, and (ii) a clock control input, wherein the propagation of the inverted data from the output node to the input node is according to the clock control input.

19. The method of 18, wherein the selecting between the data from the output node and the scan input signal is based upon the scan enable signal.

20. The method of claim 19, further comprising:
blocking data from reaching the input node when the scan enable signal is active.

* * * * *